(12) United States Patent
Meyers et al.

(10) Patent No.: US 12,013,435 B2
(45) Date of Patent: Jun. 18, 2024

(54) CALIBRATION SYSTEM AND METHOD

(71) Applicant: Westinghouse Electric Company LLC, Cranberry Township, PA (US)

(72) Inventors: Timothy S. Meyers, Finleyville, PA (US); Daniel G. Gruber, White Oak, PA (US); Mark A. Bartels, Greensburg, PA (US); Kenneth J. Swidwa, North Huntingdon, PA (US)

(73) Assignee: Westinghouse Electric Company LLC, Cranberry Township, PA (US)

( * ) Notice: Subject to any disclaimer, the term of this patent is extended or adjusted under 35 U.S.C. 154(b) by 248 days.

(21) Appl. No.: 17/595,118

(22) PCT Filed: May 7, 2020

(86) PCT No.: PCT/US2020/031758
§ 371 (c)(1),
(2) Date: Nov. 9, 2021

(87) PCT Pub. No.: WO2020/231717
PCT Pub. Date: Nov. 19, 2020

(65) Prior Publication Data
US 2022/0229111 A1 Jul. 21, 2022

Related U.S. Application Data

(60) Provisional application No. 62/845,980, filed on May 10, 2019.

(51) Int. Cl.
*G01R 31/3185* (2006.01)
*G01R 35/00* (2006.01)

(52) U.S. Cl.
CPC ... *G01R 31/318519* (2013.01); *G01R 35/005* (2013.01)

(58) Field of Classification Search
None
See application file for complete search history.

(56) References Cited

U.S. PATENT DOCUMENTS

| | | |
|---|---|---|
| 4,581,585 A | 4/1986 | Bristol |
| 7,348,914 B1 * | 3/2008 | Hazanchuk ........... H03M 1/124 341/110 |

(Continued)

FOREIGN PATENT DOCUMENTS

| | | |
|---|---|---|
| CN | 105119704 A | 12/2015 |
| CN | 107370545 A | 11/2017 |

(Continued)

OTHER PUBLICATIONS

International Search Report and Written Opinion for International PCT Application No. PCT/US2020/031758, dated Aug. 28, 2020.

(Continued)

*Primary Examiner* — Jany Richardson
(74) *Attorney, Agent, or Firm* — K&L Gates LLP (57) ABSTRACT

A calibration system is disclosed. The calibration system includes a waveform generator configured to generate a periodic waveform and a control circuit in signal communication with the waveform generator. The control circuit includes an analog-to-digital converter configured to convert the periodic waveform to digital values and an electronic device in signal communication with the analog-to-digital converter. The electronic device is configured to verify calibration of (1) timing of the control circuit and (2) voltage levels of the control circuit based on the periodic waveform.

20 Claims, 3 Drawing Sheets

(56) References Cited

U.S. PATENT DOCUMENTS

| | | |
|---|---|---|
| 8,756,029 B2 | 6/2014 | Bandsmer |
| 9,270,291 B1 * | 2/2016 | Parnaby ................. H04B 17/21 |
| 9,667,407 B1 | 5/2017 | Liu et al. |
| 2008/0109504 A1 | 5/2008 | McDonald |
| 2012/0239108 A1 | 9/2012 | Foutz et al. |
| 2014/0097976 A1 | 4/2014 | Mattes et al. |
| 2015/0341158 A1 | 11/2015 | Wu et al. |
| 2016/0072491 A1 | 3/2016 | Bowman et al. |

FOREIGN PATENT DOCUMENTS

| | | |
|---|---|---|
| EP | 3450995 A1 | 3/2019 |
| WO | 2020231717 A1 | 11/2020 |

OTHER PUBLICATIONS

1 Search Report from corresponding Russian Application No. 2021134556, dated Oct. 17, 2023 (English Translation).

* cited by examiner

CALIBRATION SYSTEM AND METHOD

CROSS-REFERENCE TO RELATED APPLICATIONS

This application is a U.S. National Stage Entry under 35 U.S.C. 0 371 of International Patent Application No. PCT/US2020/031758, entitled CALIBRATION SYSTEM AND METHOD, filed May 7, 2020, which claims the benefit under 35 U.S.C. § 119(e) to U.S. Provisional Patent Application No. 62/845,980, filed May 10, 2019, the entire disclosures of which are hereby incorporated by reference herein.

FIELD

This application discloses an invention which is related, generally and in various aspects, to systems and methods of calibrating devices, circuits and/or systems.

BACKGROUND

It is now more common for nuclear power plants to utilize one or more field-programmable gate arrays (FPGAs) in at least one of their various control circuits. In addition to including one or more FPGAs, such control circuits also include other devices/components such as, for example, sensors, input/outputs cards, analog-to digital converters and processors to monitor and/or control the operation of the nuclear power plant. In general, output signals generated by the sensors, which are indicative of a sensed or measured parameter, are input to input/output cards, which are connected to an FPGA, which in turn can be connected to a processor. For instances where an output signal generated by a sensor is an analog signal, an analog-to-digital converter is utilized to convert the analog signal to a corresponding digital signal. In various configurations, the analog-to-digital conversion can be performed by the input/output card, by an analog-to-digital converter connected to the input/output card, or by the FPGA.

In some nuclear power plant control circuits, several of these devices/components are packaged together in an electronic device such as, for example, the CompactRIO (cRIO) controller manufactured National Instruments. In applications where the electronic device provides only a monitoring function, a digital value output by the FPGA of the electronic device may be input to a computer system or other processing device that aggregates the outputs of multiple FPGAs. In applications where the electronic device functions as a controller, the electronic device may perform a control function based on the output signal of one or more of the sensors (or on other conditions).

In order to ensure that such control circuits are operating properly, the calibration of the control circuit can be verified. In particular, the calibration of the timing of the control circuit and the calibration of the analog voltages present within the control circuit can be verified. If the calibrations of either the timing or the analog voltages are not verified, the calibrations can be adjusted so that the control circuit is in proper calibration going forward. Known processes for verification and calibration are time consuming processes. For example, one known process includes verifying the timing of the control circuit and then individually injecting multiple different voltage levels to verify the analog voltages present within the control circuit. Similar processes are currently utilized to verify calibrations of devices and/or systems.

There is room for improvement in systems and methods of calibrating devices, circuits and/or systems.

BRIEF DESCRIPTION OF THE DRAWINGS

The novel features of the aspects described herein are set forth with particularity in the appended claims. The aspects, however, both as to organization and methods of operation may be better understood by reference to the following description, taken in conjunction with the accompanying drawings.

DETAILED DESCRIPTION

It is to be understood that at least some of the figures and descriptions of the invention have been simplified to illustrate elements that are relevant for a clear understanding of the invention, while eliminating, for purposes of clarity, other elements that those of ordinary skill in the art will appreciate may also comprise a portion of the invention. However, because such elements are well known in the art, and because they do not facilitate a better understanding of the invention, a description of such elements is not provided herein.

In the following detailed description, reference is made to the accompanying drawings, which form a part hereof. In the drawings, similar symbols and reference characters typically identify similar components throughout several views, unless context dictates otherwise. The illustrative aspects described in the detailed description, drawings and claims are not meant to be limiting. Other aspects may be utilized, and other changes may be made, without departing from the scope of the technology described herein.

The following description of certain examples of the technology should not be used to limit its scope. Other examples, features, aspects, embodiments and advantages of the technology will become apparent to those skilled in the art from the following description, which is by way of illustration, one of the best modes contemplated for carrying out the technology. As will be realized, the technology described herein is capable of other different and obvious aspects, all without departing from the technology. Accordingly, the drawings and descriptions should be regarded as illustrative in nature and not restrictive.

It is further understood that any one or more of the teachings, expressions, aspects, embodiments, examples, etc. described herein may be combined with any one or more of the other teachings, expressions, aspects, embodiments, examples, etc. that are described herein. The following described teachings, expressions, aspects, embodiments, examples, etc. should therefore not be viewed in isolation relative to each other. Various suitable ways in which the teachings herein may be combined will be readily apparent to those of ordinary skill in the art in view of the teachings herein. Such modifications and variations are intended to be included within the scope of the claims.

Before explaining the various aspects of the calibration system in detail, it should be noted that the various aspects disclosed herein are not limited in their application or use to the details of construction and arrangement of parts illustrated in the accompanying drawings and description. Rather, the disclosed aspects may be positioned or incorporated in other aspects, embodiments, variations and modifications thereof, and may be practiced or carried out in various ways. Accordingly, aspects of the calibration system disclosed herein are illustrative in nature and are not meant to limit the scope or application thereof. Furthermore, unless otherwise indicated, the terms and expressions employed herein have been chosen for the purpose of describing the aspects for the convenience of the reader and are not meant to limit the scope thereof. In addition, it should be understood that any one or more of the disclosed aspects, expressions of aspects, and/or examples thereof, can be combined with any one or more of the other disclosed aspects, expressions of aspects, and/or examples thereof, without limitation.

Also, in the following description, it is to be understood that terms such as inward, outward, upward, downward, above, top, below, floor, left, right, side, interior, exterior and the like are words of convenience and are not to be construed as limiting terms. Terminology used herein is not meant to be limiting insofar as devices described herein, or portions thereof, may be attached or utilized in other orientations. The various aspects will be described in more detail with reference to the drawings.

Figure 1:
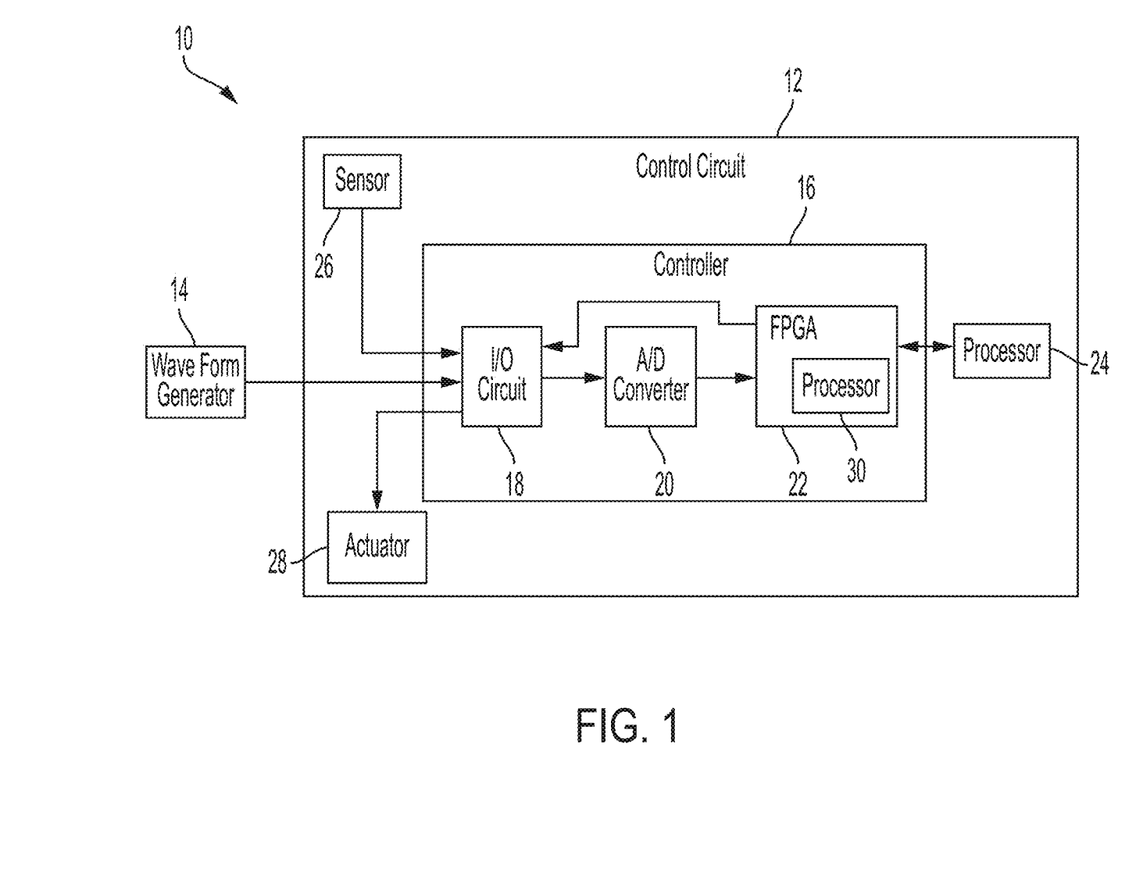
FIG. 1 illustrates a calibration system, in accordance with at least one aspect of the present disclosure.

FIG. 1 illustrates a calibration system 10, in accordance with at least one aspect of the present disclosure. The calibration system 10 will be described in the context of its use to calibrate a control circuit 12 of a nuclear power plant. However, it will be appreciated that the calibration system 10 can be utilized to calibrate any number of different devices (an FPGA, a computer, a programmable logic controller, an input/output circuit, etc.), circuits and/or systems. The calibration system 10 includes a waveform generator 14 and a controller 16. The controller 16 includes an input/output circuit 18, an analog-to-digital (A/D) converter 20 and an FPGA 22. According to various aspects, the calibration system 10 may also include a processor 24 connected to the FPGA 22.

Figure 2:
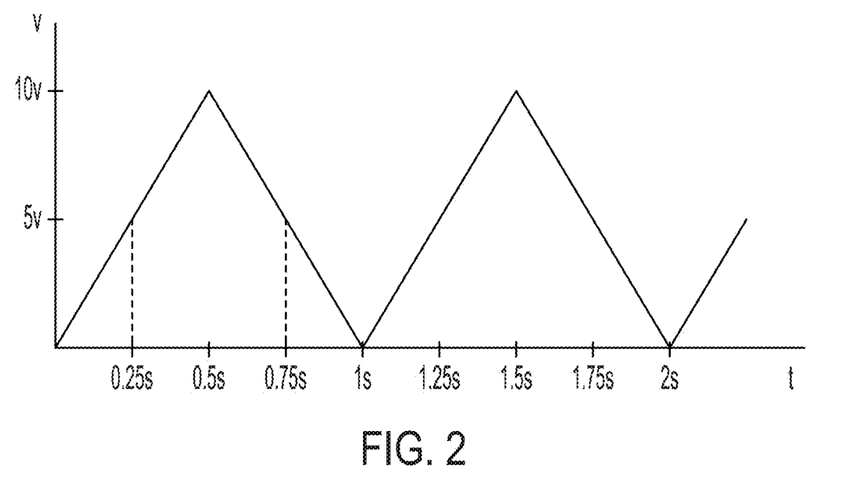
FIG. 2 illustrates an exemplary triangular wave generated by a waveform generator of the calibration system of FIG. 1.
Figure 3:
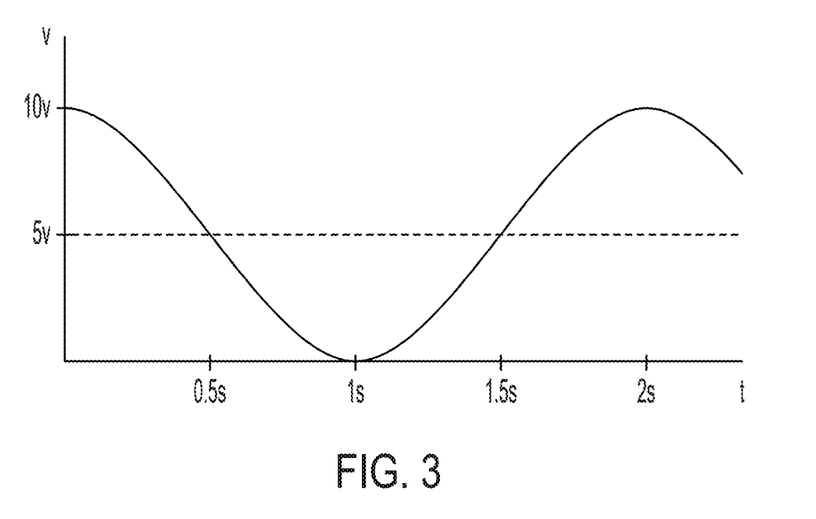
FIG. 3 illustrates an exemplary sine wave generated by the waveform generator of the calibration system of FIG. 1.

The waveform generator 14 is configured to generate one or more waveforms. For example, according to various aspects, the waveform generator 14 may be configured to generate one or more waveforms such as triangular waves, sine waves, square waves, sawtooth waves, etc. of different amplitudes over a wide range of frequencies. An exemplary triangular wave generated by the waveform generator 14 is shown in FIG. 2, where the triangular wave is a 1 Hz, 0-10V triangular wave. An exemplary sine wave generated by the waveform generator 14 is shown in FIG. 3, where the sine wave is a 0.5 Hz, 0-10V sine wave. Of course, different frequencies, amplitudes and/or waveforms other than those shown in FIGS. 2 and 3 may be generated by the waveform generator 14. As shown in FIG. 1, the waveform generator 14 is connected to (in signal communication with) the control circuit 12. More specifically, the waveform generator 14 is connected to (in signal communication with) the input/output circuit 18 of the controller 16.

The input/output circuit 18 is configured to receive analog signals at its input terminals (not shown for purposes of clarity). For example, the input/output circuit 18 may receive analog signals from a sensor 26. Although only one sensor 26 is shown in FIG. 1, it will be appreciated that the input/output circuit 18 may receive analog signals from a plurality of sensors 26 such as, for example, flow sensors, position sensors, pressure sensors, temperature sensors, etc. According to various aspects, the input/output circuit 18 may include any number of input/output cards (analog I/O cards, digital I/O cards and/or mixed I/O cards) and may be configured to accommodate both analog and digital inputs/outputs. For example, according to various aspects, the input/output circuit 18 is further configured to output a control signal to an actuator 28. Although only one actuator 28 is shown in FIG. 1, it will be appreciated that the input/output circuit 18 may output control signals to a plurality of actuators 28 to control a valve, a motor, a pump, etc.

The A/D converter 20 is connected to (in signal communication with) the input/output circuit 18, and is configured to convert the analog signals received from the input/output circuit 18 into corresponding digital signals or digital values which are representative of the analog signals. Although only one A/D converter 20 is shown in FIG. 1 for purposes of clarity, it will be appreciated that the controller 16 may include any number of A/D converters 20. For example, according to various aspects, the controller 16 includes a separate A/D converter 20 for each analog input/output card in the input/output circuit 18. According to various aspects, the A/D converter 20 forms a part of the input/output circuit 18.

The FPGA 22 is connected to (in signal communication with) the A/D converter 20, and is configured to process the digital signals and/or digital values received from the A/D converter 20. According to various aspects, the A/D converter 20 forms a part of the FPGA 22. In addition to performing signal processing, the FPGA 22 may also be utilized for control, filtering, timing and/or other logic functions. As shown in FIG. 1, according to various aspects, the FPGA 22 also includes a processor 30 which is in signal communication with the FPGA 22. The processor 30 may be utilized for communication, signal processing and/or executing algorithms or routines which are stored in a memory associated with the processor 30. The processor 30 can execute one or more such algorithms or routines to implement and control the functionality of the FPGA 22. According to various aspects, the processor 30 interprets the digital signals or digital values output by the A/D converter 20 and responsively causes the FPGA 22 to output one or more digital signals. Such signals may be control signals to control one or more components of the control circuit 12 and/or informational signals to provide information such as a characteristic sensed by an analog sensor 26. According to various aspects, the FPGA 22, or the combination of the FPGA 22 and the processor 30, may be considered a processing circuit.

The processor 24 can be in signal communication with the processor 30, and may be utilized, for example, to format information provided by the processor 30 (e.g., information associated with an analog sensor 26 connected to the input/output circuit 18) so that the information can be displayed on a monitor (not shown) connected to the processor 24.

In order to ensure that certain control circuits employed in nuclear power plants or other applications are operating properly, the calibration of the control circuit can be verified by a calibration algorithm or routine executed by the processor 30 of the FPGA 22. With the calibration algorithm or routine, the processor 30 can verify the timing and voltage levels of the control circuit 12 based on a waveform generated by the waveform generator 14. For example, the sampling rate of the analog signals received by the input/output circuit 18 can be utilized to verify the timing of the control circuit 12 and the voltage levels of the analog signals received by the input/output circuit 18 can be utilized to verify the voltage levels of the control circuit 12. If the calibrations of either the timing or the analog voltages are not verified, the calibrations can be adjusted so that the control circuit 12 is in proper calibration going forward. For example, with respect to the timing of the control circuit 12, loop times utilized by the FPGA 22 can be adjusted to bring the timing into proper calibration. According to other aspects, the calibration or routine can be executed by a processing circuit other than the FPGA 22 and the processor 30.

According to various aspects, to calibrate the control circuit 12, a periodic waveform generated by the waveform generator 14 is input to the input/output circuit 18. The waveform may be input to a test terminal block (not shown) of the input/output circuit 18. The processor 30 initiates the execution of the calibration algorithm or routine. The calibration algorithm or routine may be initiated automatically, such as in response to receiving the periodic waveform at a particular input of the input/output circuit 18 (e.g. a test terminal block), or manually in response to an input or command from a user or device.

Information indicating the type of periodic waveform, the frequency of the periodic waveform and various voltage test points on the periodic waveform may be stored in a memory accessible by the processor 30. According to various aspects, information indicating threshold tolerances for the timing and for each of the voltage test points may also be stored in the memory accessible by the processor 30. The information may be stored in the memory when the FPGA 22 is programmed, such as at time of manufacture. However, it will be appreciated that the FPGA 22 programming can be subsequently updated.

As part of the calibration algorithm or routine, the processor 30 is configured to verify that the timing of the control circuit 12 is within a predetermined threshold tolerance. According to various aspects, the analog signal of the periodic waveform is sampled, and the sampled analog values are converted to digital signals or digital values by the A/D converter 20. The digital signals or digital values are provided to the FPGA 22 and in turn to the processor 30. The processor 30 utilizes the digital signals or digital values to determine the frequency of the periodic waveform. The processor 30 can then compare the determined frequency of the periodic waveform with the known frequency of the periodic waveform stored in the memory. If the determined frequency is within the predetermined threshold tolerance of the known frequency, the timing calibration of the control circuit 12 is considered to be verified. For example, if the periodic waveform has a known frequency of 1 Hz and the predetermined threshold tolerance is 1%, the timing calibration of the control circuit 12 will be considered to be verified if the determined frequency is within 1% of the known frequency of 1 Hz.

However, if the determined frequency is not within the predetermined threshold tolerance, the FPGA 22 (or the processor 30 of the FPGA 22) can be utilized to adjust the calibration of the timing (e.g., by adjusting loop times utilized by the FPGA 22) to bring the timing into proper calibration (i.e., within the predetermined threshold tolerance).

As part of the calibration algorithm or routine, the processor 30 is also configured to verify that each of the sampled voltage levels along the periodic waveform is within a predetermined threshold tolerance. Once the timing of the control circuit 12 has been verified or brought into proper calibration, the processor 30 can utilize the verified timing to verify each of the sampled voltage levels along the periodic waveform is within the predetermined threshold tolerance. For example, voltage levels associated with a 0-10V periodic waveform such as the triangular wave of FIG. 2 include 0V, 2.5V, 5V, 7.5V, and 10V. Because the timing of the control circuit 12 and the frequency of the periodic waveform are known, the calibration algorithm or routine knows when these voltage levels should occur in the periodic waveform. For the 1 Hz, 0-10V triangular wave of FIG. 2, the amplitude of the periodic waveform should be 5V at 0.25 s and at 0.75s after the start of a period of the waveform, as is shown for example in FIG. 2. Since the timing has been verified or brought into proper calibration as described above, the processor 30 can utilize the digital signals or digital values corresponding to each of the sampled voltage levels at specific times to compare the sampled voltage values with the expected voltage values. If the sampled voltage values are each within the predetermined threshold tolerance of the expected voltage values, the voltage value calibration of the control circuit 12 is considered to be verified.

However, if any of the sampled voltage values are not within the predetermined threshold tolerance of the expected voltage values, the FPGA 22 (or the processor 30 of the FPGA 22) can be utilized to adjust the calibration of the voltage values (e.g., by adjusting the amplitude of analog signals at the input/output circuit 18) to bring the voltage values into proper calibration (i.e., within the predetermined threshold tolerance). It will be appreciated that any number of voltage levels may be sampled and verified or adjusted, and that any predetermined threshold tolerance (e.g., 0.25%, 0.5%, 1%, etc.) may be utilized for the verification or calibration process. In general, a given predetermined threshold tolerance will be set on a case-by-case basis.

When the control circuit 12 is properly calibrated, the timing and voltage levels it utilizes to make control decisions are accurate to the extent they are within the predetermined threshold tolerances of the known/expected timing and voltage levels. If the predetermined threshold tolerance for a given application is 1% and the control circuit 12 interprets an actual 2.5V analog signal as being a 2.8V analog signal, the control circuit 12 is not properly calibrated and a control operation based on the interpreted voltage level could be unintended, improper and/or unsafe. For these and other reasons, verifying proper calibration and/or adjusting calibration have calibration become part of ongoing maintenance in nuclear plants or other applications. By utilizing the calibration algorithm or routine as described above, the time taken to verify and/or adjust the calibrations are significantly reduced. For example, the control circuit 12 can use as little as one period of a periodic waveform received from the waveform generator 14 to calibrate itself or verify its own calibration, greatly increasing the speed of the calibration process. As a facility such as a nuclear plant may include numerous control circuits 12 that need calibrated, increasing the speed of calibration significantly reduces maintenance time.

Figure 4:
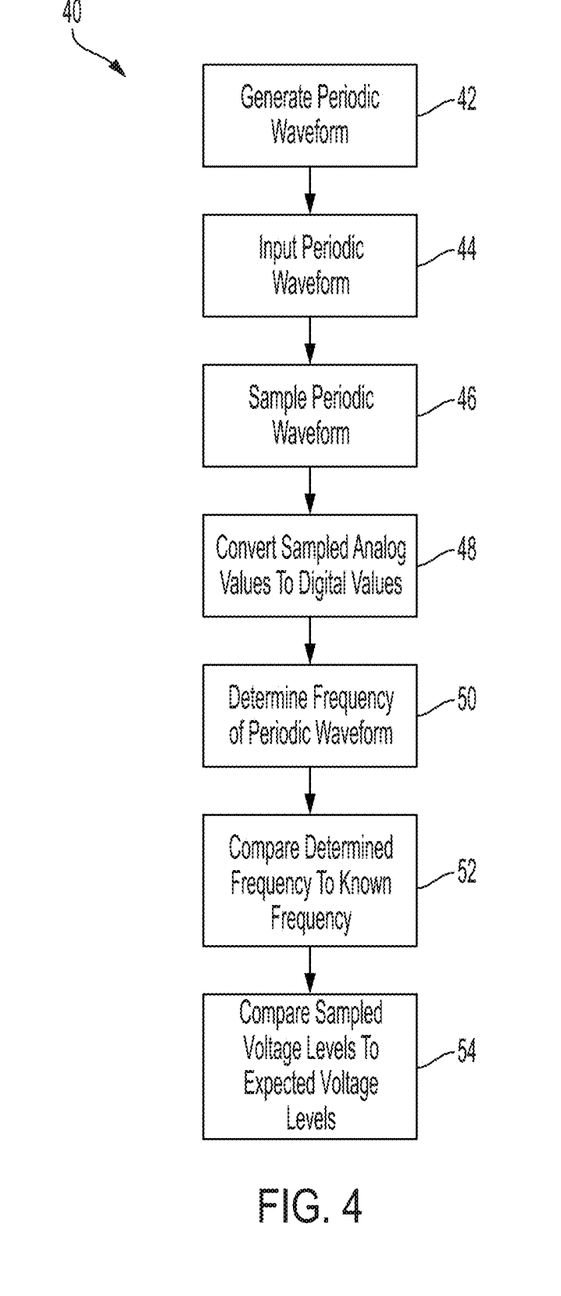
FIG. 4 illustrates a calibration method, in accordance with at least one aspect of the present disclosure.

FIG. 4 illustrates a method 40 of calibrating a control circuit, in accordance with at least one aspect of the present disclosure. Although the method 40 is described in the context of calibrating the control circuit 12, it will be appreciated that the method 40 may be utilized to calibrate any number of different devices (an FPGA, a computer, a programmable logic controller, an input/output circuit, etc.), circuits and/or systems. The method 40 may be implemented using the calibration system 10 or other similar systems. For purposes of simplicity, the implementation of the method 40 will be described in the context of the control circuit 12.

For the method 40, a periodic waveform is generated 42 by, for example, the waveform generator 14. The periodic waveform is input 44 to an analog input of the input/output circuit 18. The analog signal of the periodic waveform is sampled 46 by the FPGA 22, and the sampled analog values are converted 48 to digital signals or digital values by the A/D converter 20.

The digital signals or digital values are utilized by the processor 30 to determine 50 the frequency of the periodic waveform. The processor 30 compares 52 the determined frequency to the known frequency of the periodic waveform. If the determined frequency is within a predetermined threshold tolerance of the known frequency, the timing of the control circuit 12 is considered to be properly calibrated. If the determined frequency is not within the predetermined threshold tolerance of the known frequency, the timing of the control circuit 12 is adjusted to bring the timing into proper calibration.

After the calibration of the timing of the control circuit 12 has been verified or adjusted to be brought into proper calibration, the digital signals or digital values corresponding to the various sampled voltage levels along the periodic waveform and the known frequency of the periodic waveform are utilized by the processor 30 to compare 54 each of the sampled voltage levels along the periodic waveform with the expected voltage levels (the calibration algorithm or routine knows when the expected voltage levels should occur in the periodic waveform). If each of the various sampled voltage levels is within a predetermined threshold tolerance of the expected voltage levels, the voltage levels of the control circuit 12 are considered to be properly calibrated. If each of the various sampled voltage levels is not within a predetermined threshold tolerance of the expected voltage levels, the voltage levels of the control circuit 12 are adjusted to bring the voltage levels into proper calibration. The plurality of voltage levels can be compared to the expected voltage levels sequentially or in parallel.

The above-described method 40 may be repeated periodically or continuously, and may be repeated any number of times.

EXAMPLES

Example 1—A calibration system is provided. The calibration system comprises a waveform generator configured to generate a periodic waveform and a control circuit in signal communication with the waveform generator. The control circuit comprises an analog-to-digital converter configured to convert the periodic waveform to digital values and an electronic device in signal communication with the analog-to-digital converter. The electronic device is configured to verify calibration of (1) timing of the control circuit and (2) voltage levels of the control circuit based on the periodic waveform.

Example 2—The calibration system of Example 1, wherein the periodic waveform comprises a triangular wave.

Example 3—The calibration system of Example 1, wherein the periodic waveform comprises a sine wave.

Example 4—The calibration system of Examples 1, 2 or 3, wherein the electronic device comprises a field-programmable gate array.

Example 5—The calibration system of Examples 1, 2, 3 or 4, wherein the analog-to-digital converter forms a part of the electronic device.

Example 6—The calibration system of Examples 1, 2, 3, 4 or 5, wherein the control circuit further comprises an input/output circuit connected to the analog-to-digital converter.

Example 7—The calibration system of Examples 1, 2, 3, 4, 5 or 6, wherein the input/output circuit forms a part of the electronic device.

Example 8—The calibration system of Examples 1, 2, 3, 4, 5, 6 or 7, wherein the control circuit further comprises a processor in signal communication with the electronic device.

Example 9—The calibration system of Example 8, wherein the processor forms a part of the electronic device.

Example 10—The calibration system of Examples 1, 2, 3, 4, 5, 6, 7, 8 or 9, wherein the calibration system further comprises a processor in signal communication with the control circuit.

Example 11—An electronic device is provided. The electronic device comprises an analog-to-digital converter configured to convert a periodic waveform to digital values and a processing circuit in signal communication with the analog-to-digital converter. The processing circuit is configured to verify calibration of (1) timing of the electronic device and (2) voltage levels of the electronic device based on the periodic waveform.

Example 12—The electronic device of Example 11, wherein the processing circuit comprises a field-programmable gate array.

Example 13—The electronic device of Examples 11 or 12, wherein the processing circuit further comprises a processor.

Example 14—The electronic device of Examples 11, 12 or 13, further comprising an input/output circuit in signal communication with the analog-to-digital converter.

Example 15—A calibration method is provided. The calibration method comprises generating a periodic waveform, inputting the generated periodic waveform into an electronic device, calibrating timing of the electronic device based on the inputted periodic waveform and calibrating voltage levels in the electronic device based on the inputted periodic waveform.

Example 16—The calibration method of Example 15, wherein calibrating timing of the electronic device based on the inputted periodic waveform comprises determining a frequency of the inputted periodic waveform.

Example 17—The calibration method of Example 16, wherein calibrating timing of the electronic device based on the inputted periodic waveform further comprises comparing the determined frequency of the inputted periodic waveform with a known frequency.

Example 18—The calibration method of Example 17, wherein calibrating timing of the electronic device based on the inputted periodic waveform further comprises determining whether the determined frequency of the inputted periodic waveform is within a threshold tolerance of the known frequency.

Example 19—The calibration method of Examples 15, 16, 17 or 18, wherein calibrating voltage levels in the electronic device based on the inputted periodic waveform comprises comparing sampled voltage levels of the inputted periodic waveform with expected voltage levels.

Example 20—The calibration method of Examples 19, wherein calibrating voltage levels in the electronic device based on the inputted periodic waveform further comprises determining whether each of the sampled voltage levels of the inputted periodic waveform is within a threshold tolerance of the expected voltage levels.

Although the various aspects of the calibration system 10 and calibration method 40 have been described herein in connection with certain disclosed aspects, many modifications and variations to those aspects may be implemented. Also, where materials are disclosed for certain components, other materials may be used. Furthermore, according to various aspects, a single component may be replaced by multiple components, and multiple components may be replaced by a single component, to perform a given function or functions. The foregoing description and the appended claims are intended to cover all such modifications and variations as falling within the scope of the disclosed aspects.

While this invention has been described as having exemplary designs, the described invention may be further modified within the spirit and scope of the disclosure. This application is therefore intended to cover any variations, uses, or adaptations of the invention using its general principles. For example, although the invention was described in the context of a control circuit 12, the general principles of the invention are equally applicable to any type of device, circuit and/or system which converts analog signals into digital values. Similarly, although the invention was also described in the context of a nuclear power plant, the general principles of the invention are also equally applicable to applications other than nuclear power plants.

Any patent, patent application, publication, or other disclosure material, in whole or in part, that is said to be incorporated by reference herein is incorporated herein only to the extent that the incorporated materials does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

What is claimed is:

1. A calibration system, comprising:
   a waveform generator configured to generate a periodic waveform; and
   a control circuit in signal communication with the waveform generator, wherein the control circuit comprises:
   an analog-to-digital converter configured to convert the periodic waveform to digital values; and
   an electronic device in signal communication with the analog-to-digital converter, wherein the electronic device is configured to utilize the digital values associated with one period of the periodic waveform to automatically verify the following:
   a timing calibration of the control circuit is within a first predetermined threshold tolerance; and
   a voltage level calibration of the control circuit is within a second predetermined threshold tolerance.

2. The calibration system of claim 1, wherein the periodic waveform comprises a triangular wave.

3. The calibration system of claim 1, wherein the periodic waveform comprises a sine wave.

4. The calibration system of claim 1, wherein the electronic device comprises a field-programmable gate array.

5. The calibration system of claim 1, wherein the analog-to-digital converter forms a part of the electronic device.

6. The calibration system of claim 1, wherein the control circuit further comprises an input/output circuit connected to the analog-to-digital converter.

7. The calibration system of claim 6, wherein the input/output circuit forms a part of the electronic device.

8. The calibration system of claim 1, wherein the control circuit further comprises a processor in signal communication with the electronic device.

9. The calibration system of claim 8, wherein the processor forms a part of the electronic device.

10. The calibration system of claim 1, wherein the calibration system further comprises a processor in signal communication with the control circuit.

11. An electronic device, comprising:
    an analog-to-digital converter configured to convert a periodic waveform to digital values; and
    a processing circuit in signal communication with the analog-to-digital converter, wherein the processing circuit is configured to utilize the digital values associated with one period of the periodic waveform to automatically verify the following:
    a timing calibration of the electronic device is within a first predetermined threshold tolerance; and
    a voltage level calibration of the electronic device is within a second predetermined threshold tolerance.

12. The electronic device of claim 11, wherein the processing circuit comprises a field-programmable gate array.

13. The electronic device of Claim 12, wherein the processing circuit further comprises a processor.

14. The electronic device of claim 11, further comprising an input/output circuit in signal communication with the analog-to-digital converter.

15. A calibration verification method, comprising:
    generating a periodic waveform;
    inputting the generated periodic waveform into an electronic device;
    converting the periodic waveform to digital values;
    utilizing the digital values associated with one period of the periodic waveform to automatically verify:
    a timing calibration of the electronic device is within a first predetermined threshold tolerance; and
    a voltage level calibration of the electronic device is within a second predetermined threshold tolerance.

16. The calibration verification method of claim 15, wherein automatically verifying the timing calibration of the electronic device comprises determining a frequency of the inputted periodic waveform.

17. The calibration verification method of claim 16, wherein automatically verifying the timing calibration of the electronic device further comprises comparing the determined frequency of the inputted periodic waveform with a known frequency.

18. The calibration verification method of claim 17, wherein automatically verifying the timing calibration of the electronic device further comprises determining whether the determined frequency of the inputted periodic waveform is within a threshold tolerance of the known frequency.

19. The calibration verification method of claim 15, wherein automatically verifying the voltage level calibration of the electronic device comprises comparing sampled voltage levels of the inputted periodic waveform with expected voltage levels.

20. The calibration verification method of claim 19, wherein automatically verifying the voltage level calibration of the electronic device further comprises determining whether each of the sampled voltage levels of the inputted periodic waveform is within a threshold tolerance of the expected voltage levels.

* * * * *